United States Patent
Murata et al.

(10) Patent No.: US 7,208,988 B2
(45) Date of Patent: Apr. 24, 2007

(54) CLOCK GENERATOR

(75) Inventors: Makoto Murata, Kyoto (JP); Yoko Nomaguchi, Kyoto (JP); Shizuka Yokoi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/684,704

(22) Filed: Oct. 15, 2003

(65) Prior Publication Data

US 2004/0085108 A1 May 6, 2004

(30) Foreign Application Priority Data

Oct. 31, 2002 (JP) ............................. 2002-317695

(51) Int. Cl.
*H03L 7/06* (2006.01)
(52) U.S. Cl. ...................... 327/148; 327/157
(58) Field of Classification Search ................ 327/158, 327/161, 153, 149, 141, 147, 148, 162, 261, 327/157
See application file for complete search history.

(56) References Cited

U.S. PATENT DOCUMENTS

| | | | | |
|---|---|---|---|---|
| 4,922,141 A | * | 5/1990 | Lofgren et al. | ............. 327/158 |
| 5,663,665 A | * | 9/1997 | Wang et al. | .................... 327/3 |
| 5,926,047 A | * | 7/1999 | Harrison | ...................... 327/159 |
| 6,326,826 B1 | * | 12/2001 | Lee et al. | .................... 327/161 |
| 6,483,791 B1 | * | 11/2002 | Asada et al. | ............. 369/59.11 |

FOREIGN PATENT DOCUMENTS

| | | |
|---|---|---|
| JP | 11-015550 A | 1/1999 |
| JP | 11-205102 A | 7/1999 |
| JP | 2001-148690 A | 5/2001 |
| JP | 2001-202153 A | 7/2001 |
| JP | 2001-320353 A | 11/2001 |
| WO | WO 01/71918 A1 | 9/2001 |

* cited by examiner

*Primary Examiner*—Linh My Nguyen
(74) *Attorney, Agent, or Firm*—Sughrue Mion, PLLC

(57) ABSTRACT

The clock generator of this invention saves a buffer memory for the data transfer interface, which has conventionally been required, when using a spectrum spread clock in circuits and devices inside a system. The clock generator can easily be applied as the operational clock in a system, and enhances the performance of the system. In the clock generator, the variable delay circuit controls the phase of the reference clock generated by an oscillator. The delay setting circuit is able to vary the setting of the control voltage to the variable delay circuit at each clock cycle, and modulates the phase of the reference clock. The phase modulation means of the delay setting circuit fluctuates the cycle of the output modulation clock to thereby spread the spectrum. Also, the delay setting circuit detects the output states (edges of the clock) of delay elements of the variable delay circuit, and confines the phase difference of the reference clock and the modulated clock within a specified range (for example, half the cycle of the reference clock). Thereby, the clock generator guarantees a certain extent of synchronization in the spectrum spread clock.

7 Claims, 9 Drawing Sheets

(a) Clock without spectrum spread modulation (b) Clock with spectrum spread modulation

CLOCK GENERATOR

BACKGROUND OF THE INVENTION

1. Field of the Invention

The present invention relates to a clock generator used by electronic devices and microprocessors as the operational clock, more specifically to a clock generator that reduces undesired radiation noises (electro magnetic interferences: EMI) caused by the operational clock of a high frequency by modulating the cycle (spreading the spectrum) of the clock.

2. Description of the Related Art

Nowadays, a great many electronic devices use microprocessors and digital circuits, which have clock generators inside the circuits, and the electronic devices operate the circuits based on the clocks generated. In recent years, the frequency required for the operational clock is raised accompanied with the speeding up of operation, and the undesired radiation noises (EMI) emitting from high-speed microprocessors have been recognized as a serious problem. Some administrative agencies have moved to regulate such EMI noises. For example, the FCC (Federal Communications Commission) of US provides the test procedure for measuring the EMI noises emitting from apparatuses and the maximum permissible emission of the EMI noises, as part of the regulations to the apparatuses that generate high frequencies. In order to observe such regulations to the EMI noises by the administrative agencies, EMI countermeasures have been made in various manners. For example, development of high frequency suppressing elements, shielding of an apparatus that generates the EMI noises (metal shielding of the surroundings), and examination of circuits capable of suppressing emissions of the EMI and so forth have been pursued. However, these methods require many technical difficulties for suppressing the EMI emissions in any of them, and tremendous efforts and costs to overcome these problems, including that a large circuit board is required especially in the case of using the shielding method.

Now, as another approach to reduce the EMI noises, the method of varying a clock signal itself has been examined. As the method of varying the clock signal itself, the method of modulating the clock frequency in a manner to spread the spectrum is known, and the following patent document 1 can be cited as an example.

[Patent Document 1]

Japanese Published Unexamined Patent Application No. Hei 9-98152

However, the method disclosed in the Patent Document 1 (spread spectrum clock generator) premises controlling the oscillation frequency of a VCO (Voltage Controlled Oscillator) by a control voltage generated in accordance with a frequency modulation profile, and uses frequency dividers to a reference clock in the process of generating the control voltage. Accordingly, this method lowers a phase comparison frequency, and is likely to be influenced by disturbances of noises and so forth. Therefore, it was difficult to attain such a profile that the phases of the reference clock and a spectrum spread clock based on the reference clock have a desired periodic characteristic precisely.

And, in the case of configuring one system composed of plural devices and circuit systems, considering a case that applies a spectrum spread clock to the operations of the parts of devices and circuits inside the system, it will involve plural clocks having the phases not ensured to each other inside one system. To maintain the operation appropriately in the system using the operational clocks as shown in the patent document 1, it is necessary to design a data transfer interface between devices to be able to operate in non-synchronization. This requires an additional buffer memory.

FIG. 10 is a block diagram of a conventional data processing circuit using a spectrum spread clock, which incorporates a buffer memory.

As shown in FIG. 10, a circuit block 20 accepts input data through a flip-flop 24 based on a reference clock Rclk generated by a reference clock generator 22, and stores the data in a RAM 26.

The data stored in the RAM 26 are read based on a spectrum spread modulation clock Mclk generated by a spectrum spread modulation clock generator 23, and are supplied to a flip-flop 25. The flip-flop 25 transfers the data to a circuit block 21 on the side of a user based on the spectrum spread modulation clock Mclk.

In this manner, the conventional operation of the devices based on the spectrum spread modulation clock has needed a buffer memory (RAM 26 in FIG. 10) that temporarily holds the data, in order to avoid malfunctions resulting from that individual operational clocks come into a non-synchronous state. Accordingly, the cost is increased, and the circuit space for the buffer memory becomes necessary. Further, the constraints such as a clock speed for driving the buffer memory and so forth make the circuit design more difficult.

SUMMARY OF THE INVENTION

The present invention has been made in view of the foregoing problems contained in the conventional technique. The invention provides a clock generator that generates a spectrum spread modulation clock, which is capable of reducing the level of undesired radiation energy. The clock generator saves the buffer memory that was indispensable for the data transfer interface as already described in the conventional technique. Thereby, the invention enhances the applicability of the clock generator as the operational clocks for the parts of devices and circuits inside a system, and improves the performance of the system that applies the clock generator.

According to a first aspect of the invention, the clock generator includes an oscillator that generates a reference clock, and a phase control means that controls a phase of the reference clock generated by the oscillator according to a variable setting condition at each clock cycle. The clock generator outputs a phase controlled clock by the phase control means, and the phase control means varies the setting condition to spread a spectrum of the clock outputted.

According to a second aspect of the invention, the clock generator includes a phase control means that controls a phase of an inputted reference clock according to a variable setting condition at each clock cycle. The clock generator outputs a phase controlled clock by the phase control means, and the phase control means varies the setting condition to spread a spectrum of the clock outputted.

According to a third aspect of the invention, in the clock generator in the first or second aspect of the invention, the phase control means may include a variable delay circuit that delays the reference clock to comply with a control input according to the setting condition, and a circuit that detects a delayed state in the variable delay circuit, and regulates the control input to the variable delay circuit in such a manner that a phase difference of the phase controlled clock to the reference clock does not exceed a specific limit value defined by the reference clock cycle as a unit.

According to a fourth aspect of the invention, in the clock generator in any of the first to third aspect of the invention, the phase control means may regulate the control input according to such a profile that the phase difference of the phase controlled clock to the reference clock gradually increases and gradually decreases between the upper limit and lower limit of the specific limit value defined by the reference clock cycle as a unit.

According to a fifth aspect of the invention, in the clock generator in the third or fourth aspect of the invention, the clock generator may include a DLL circuit containing the variable delay circuit as a circuit element, and the DLL circuit and the phase control means may synthesize the control input to the variable delay circuit.

According to a sixth aspect of the invention, in the clock generator in the fifth aspect of the invention, the variable delay circuit is served as a circuit that delays the reference clock based on a control voltage, and the DLL circuit preferably includes a comparator that compares the phase of a delayed output clock from the variable delay circuit and the phase of the reference clock, and a first charge pump that generates the control voltage to the variable delay circuit according to a phase difference output from the comparator. And, the phase control means preferably uses a second charge pump of which capacity is greater than that of the first charge pump in a circuit for adjusting the control input, and generates the control voltage according to a phase difference set as a control condition.

BRIEF DESCRIPTION OF THE DRAWINGS

FIG. 9 illustrates the power spectrum of the clock generator, in which FIG. 9A is a case without the spectrum spread modulation, and FIG. 9B is a case with the spectrum spread modulation of the invention.

DETAILED DESCRIPTION OF THE PREFERRED EMBODIMENTS

The clock generator of this invention will be described on the basis of the preferred embodiment with reference to accompanying drawings.

The clock generator of this invention employs the phase modulation system that controls the phase of a reference clock according to the setting condition being variable by each clock cycle, as a means for spreading the spectrum of a generated clock. This control system fluctuates the cycle of a generated clock to thereby spread the spectrum, and confines the phase difference between the reference clock and the modulated (spectrum spread) clock as a result of the control within a specified range, which makes it possible to ensure a certain extent of synchronization in the modulated (spectrum spread) clock.

Figure 1:
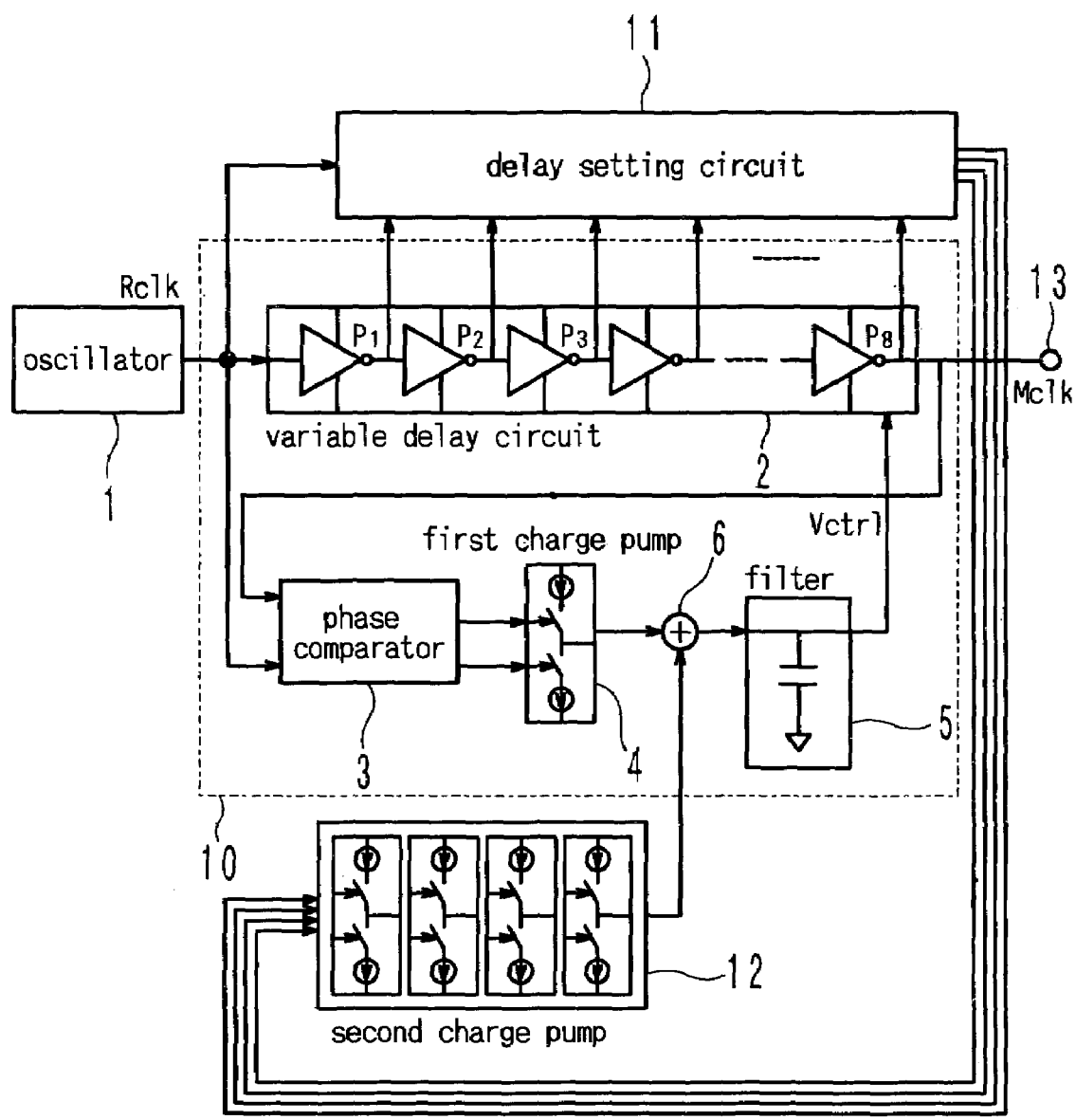
FIG. 1 is a block diagram of a spectrum spread modulation clock generator relating to the embodiment of the invention.

FIG. 1 is a block diagram of the spectrum spread modulation clock generator as one embodiment of the clock generator that contains the above components of this invention.

In the spectrum spread modulation clock generator as shown in FIG. 1, a delay synchronization (DLL) circuit 10 that operates with a reference clock as the input is served as the basic circuit. Here, the embodiment may be implemented with a circuit configuration in which a clock oscillator 1 to generate the reference clock is integrated with the delay synchronization (DLL) circuit 10, or it may be implemented with a circuit configuration in which the clock oscillator 1 is externally connected with the delay synchronization (DLL) circuit 10.

The DLL circuit 10 includes a variable delay circuit 2 composed of plural delay elements that delay the reference clock from the clock oscillator 1, a phase comparator 3 that compares the phases of the reference clock from the clock oscillator 1 and a delayed clock to be outputted from the variable delay circuit 2, a first charge pump 4 that controls an inflow current and outflow current according to an output from the phase comparator 3 to generate a control voltage Vctrl to the variable delay circuit 2, and a filter 5 that receives a current from the first charge pump 4. The output from the filter 5 is fed back to the variable delay circuit 2 as the delayed control voltage Vctrl. Here, the DLL circuit 10 may be configured such that each of the above circuit elements are integrated into an IC to form a unit circuit, and the filter 5 is connected externally.

A spectrum spread modulation clock Mclk modulated by the delay synchronization (DLL) circuit 10 is supplied from an output terminal 13 to a circuit block (not illustrated) on the side of a user as an output clock. Here, a delay setting circuit 11 is a circuit to operate a second charge pump 12 added for the purpose of regulating a current for generating a delay control voltage Vctrl corresponding to a set delay time. The second charge pump 12 has a larger capacity than the first charge pump 4, and the currents of both the charge pumps are combined at a common terminal 6 to be supplied to the variable delay circuit 2 as a control input.

Figure 2:
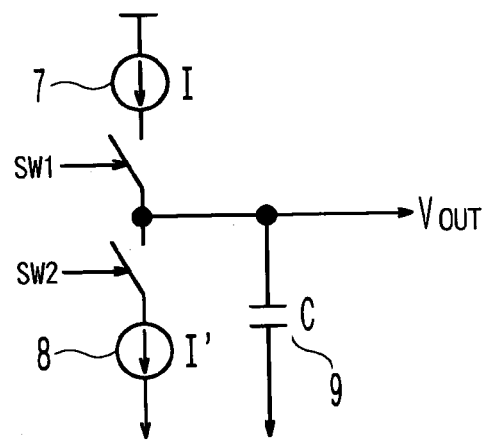
FIG. 2 is a circuit diagram illustrating a charge pump used as a circuit element in FIG. 1.

FIG. 2 is a circuit diagram illustrating one example of a charge pump used as a circuit element in FIG. 1. As shown in FIG. 2, the charge pump is composed of a first current source 7, a second current sink 8, a first switch SW1, a second switch SW2, a capacitor 9, and an output terminal Vout. Here, the charge pump receives an output signal from the pre-stage phase comparator 3 or a delay time set by the delay setting circuit 11. Turning ON either the switch SW1 or SW2 during the interval Dt, the charge pump flows a current I into the capacitor 9 from the first current source 7 through the first switch SW1 (the charged amount at this moment: DQ=IDt), or the charge pump pulls out the charges stored in the capacitor 9 from the second current sink 8 through the second switch SW2 (the discharged amount at this moment: DQ=−I'Dt). Thereby, the charge pump varies the output voltage Vout by DV (DQ/C).

The variation of this DV passes through the filter 5 to be supplied to the variable delay circuit 2 as the delay control voltage Vctrl, and this control voltage controls the phase (delay) of the output clock pulse.

Figure 3:
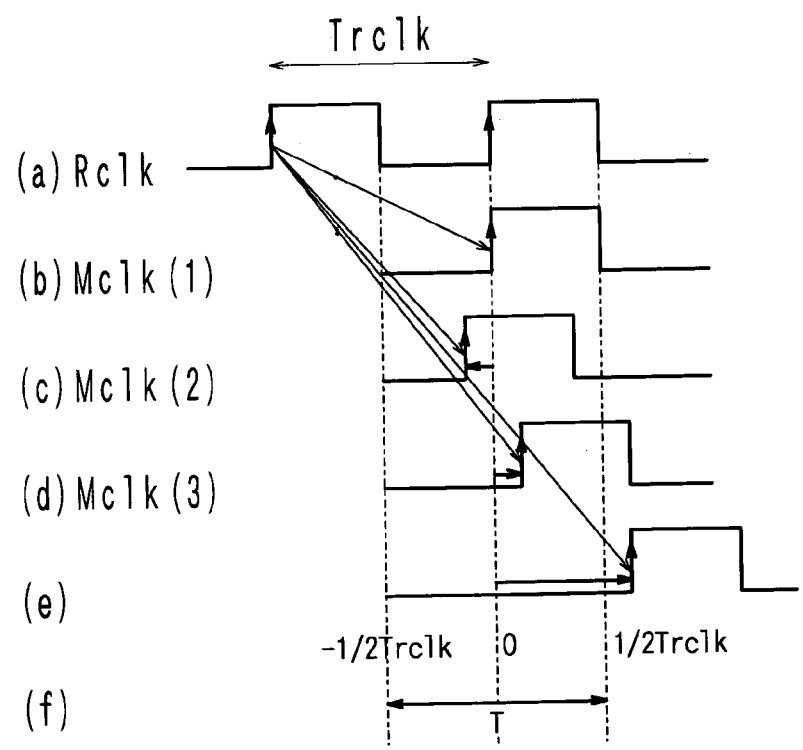
FIG. 3 is a timing chart illustrating the relation between a reference clock Rclk and a phase-modulated clock Mclk being the output of a delay setting circuit.

FIG. 3 is a timing chart illustrating the relation between the reference clock Rclk and the phase-modulated clock Mclk being the output of the variable delay circuit 2. In the drawing, FIG. 3(A) shows a waveform of the reference clock Rclk. The DLL circuit 10 controls the delay time of the variable delay circuit 2 to coincide with the cycle of the reference clock Rclk. As the result, the phase-modulated clock Mclk is delayed by one cycle in comparison to the reference clock Rclk. FIG. 3(B) shows a waveform in which the phase-modulated clock Mclk is in phase with the reference clock Rclk with one cycle delayed.

In contrast to the state in phase, when the delay control voltage Vctrl rises by DV, the phase-modulated clock Mclk leads in phase with the reference clock Rclk, as shown in FIG. 3(C). In reverse, when the delay control voltage Vctrl falls by DV, it lags in phase, as shown in FIG. 3(D).

Now, the operation of the DLL circuit 10 will be described with reference to FIG. 1. First, the phase comparator 3 detects the phase difference between the reference clock Rclk inputted to the variable delay circuit 2 and the phase-modulated clock Mclk outputted from the variable delay circuit 2, and controls the charge and discharge to and from the first charge pump 4 according to this phase difference. As the result, the delay control voltage Vctrl generated through the filter 5 is fed back negatively to the variable delay circuit 2, which regulates the delay in the direction of eliminating the phase difference, thus performing such a control operation that both the clocks Rclk and Mclk converge on the in-phase state.

In other words, as the phase of the output signal of the variable delay circuit 2 leads to that of the reference clock Rclk, the phase comparator 3 generates a signal to turn ON the switch SW2 of the first charge pump 4 during a period equivalent to the leading phase. Thereby, the first charge pump 4 pulls out the charge DQ from the capacitor 9 to lower the delay control voltage Vctrl by DV, thus delaying the phase of the output clock Mclk of the variable delay circuit 2.

In reverse, as the phase of the output signal of the variable delay circuit 2 lags to that of the reference clock Rclk, the phase comparator 3 generates a signal to turn ON the switch SW1 of the first charge pump 4 during a period equivalent to the lagging phase. Thereby, the first charge pump 4 controls to raise the delay control voltage Vctrl by DV, which advances the phase of the output clock Mclk as the result. Thus, the DLL circuit 10 operates to synchronize the phase of the output clock Mclk with the phase of the clock oscillator 1.

As above, the operation of the DLL circuit 10 in itself is the feedback control to synchronize the phase of the output clock Mclk with the phase of the reference clock Rclk.

Now in this invention, phase-modulating the reference clock Rclk spreads the spectrum of the output clock Mclk, which will be described in detail. As the means to implement this, this embodiment utilizes the variable delay circuit 2 being the element of the DLL circuit 10, and spreads the spectrum by controlling the variable delay circuit 2.

Concretely, the first charge pump 4 and the second charge pump 12 having a larger capacity than the former are connected to the common input terminal 6, and the currents of both the charge pumps are served as the control input to the variable delay circuit 2. In this case, the output signal of the second charge pump 12 is set larger compared to the output signal of the first charge pump 4; therefore, to operate the output signal of the second charge pump 12 and vary the control input will generate a clock signal of which cycle is varied intentionally.

The process of generating the spectrum spread modulation clock of this embodiment will now be described in detail.

In this invention, the phase modulation system fluctuates the cycle of the reference clock Rclk from the oscillator 1 to thereby implement the spectral spread; and in that case, it confines the phase difference of the reference clock Rclk and the modulated clock Mclk within a specified range, and ensures a certain extent of synchronization in the modulated (spectrum spread) clock.

Figure 10:
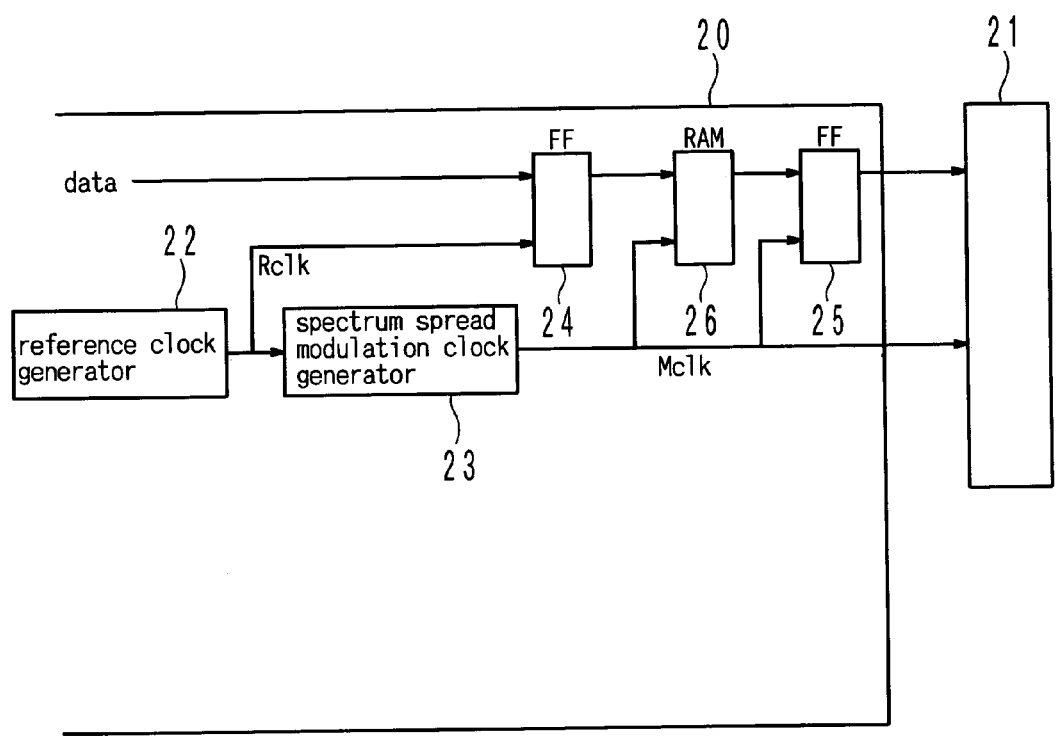
FIG. 10 is a block diagram of a conventional data processing circuit using the spectrum spread clock, incorporating a conventional buffer memory.

In the data exchange between the two systems that each use the reference clock Rclk and the modulated clock Mclk as the reference, if the certain extent of synchronization is not ensured, it will be necessary to additionally provide a means of properly carrying out the data exchange between the two systems, while regarding the intersystem as a non-synchronous interface. That is, in order to properly transmit/receive data through the interface between the two systems being non-synchronous to each other, it is necessary to provide the so-called non-synchronous interface circuit, as mentioned in the [Related Art] with reference to FIG. 10.

To guarantee a certain extent of synchronization will lead to defining the timing restriction of the interface between the two systems using the different clocks as the respective references. And, to design the timing of systems that enables data exchange under a specific timing restriction will make unnecessary the above non-synchronous interface circuit.

For example, the timing restriction is defined such that, for example, half the cycle of the reference clock Rclk is the limit of the phase difference between the reference clock Rclk and the modulated clock Mclk. In this case, if the phase difference exceeds this limit (the state shown in FIG. 3(E)), the data will be fetched at the next cycle (the data fetching is done at the rise timing of the clock pulse), which will be wrong data.

Therefore, this embodiment forces the modulated lock pulse to be between −½ Trclk and ½ Trclk, as shown in FIG. 3(F). That is, the embodiment guarantees the certain extent of synchronization by restricting the phase difference between the reference clock Rclk and the modulated clock Mclk to always be within half the cycle of the reference clock Rclk. Thereby, while it uses the spectrum spread clock, this embodiment will make the buffer memory unnecessary, which was indispensable for the data transfer interface as mentioned in the [Related Art].

Although this embodiment defines the limit of the phase difference between the reference clock Rclk and the modulated clock Mclk as half the cycle of the reference clock Rclk, this limit is only one example of the value that can appropriately be selected as the design condition of the timing restriction.

Next, the mechanism of the variable delay circuit 2 will be explained, which is used as a means for modulating the phase of the reference clock Rclk from the oscillator 1. The variable delay circuit 2 is composed of n-pieces of delay elements (8 elements in this case), each of the delay elements delays the input clock signal by a predetermined amount according to the delay control voltage Vctrl, and the final stage element outputs the modulated clock Mclk.

Figure 4:
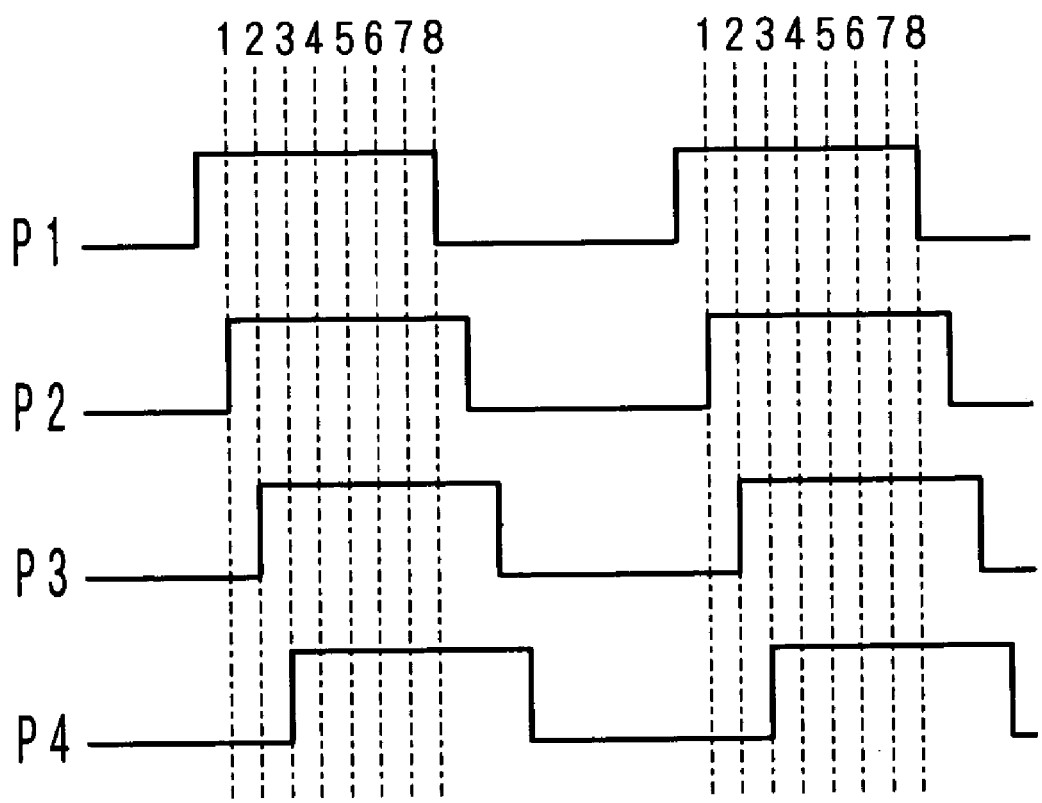
FIG. 4 is a timing chart illustrating the outputs p1, p2, ... p8 from the delay elements of a variable delay circuit.

In the variable delay circuit 2 having such a configuration, it is necessary to control the delayed output (modulated) clock Mclk so that the phase difference to the reference clock Rclk does not exceed the limit (½ cycle of the reference clock Rclk). In order to implement such a control operation, this embodiment delivers, from output terminals P1 through P8 of each delay element, delayed clocks p1 through p8 that are delayed by each element by a constant interval, as shown in FIG. 4 (FIG. 4 omits the waveforms of the output terminals P5 through P9). The delayed clocks p1 through p8 are used for the purpose of detecting the operational state of the variable delay circuit 2 from the phase relation to the reference clock Rclk, which is described later.

The means for detecting the operational state of the variable delay circuit 2 that is controlled according to the delay control voltage Vctrl will be explained hereunder. The operational state of the variable delay circuit 2 can be detected from the output states of the delayed clocks p1 through p8 generated at each output terminal of each delay element. The phase difference of the modulated clock to the reference clock is acquired according to the output states of the delayed clocks p1 through p8 of the variable delay circuit 2, at each clock cycle at that moment. And, the acquired phase difference controls the modulated clock not to exceed half the cycle Trclk of the reference clock Rclk.

Accordingly, this phase difference detection means is provided in the delay setting circuit 11 that sets the control input to the variable delay circuit 2 according to the detected result, and the delayed clocks having different phases, which are outputted from the terminals P1 through P8 of each delay element, are inputted to the phase difference detection means of the delay setting circuit 11.

Here will be explained in detail the method of detecting the phase difference of the modulated clock to the reference clock from the output states of the output terminals P1 through P8 of each delay element of the variable delay circuit 2.

Figure 5:
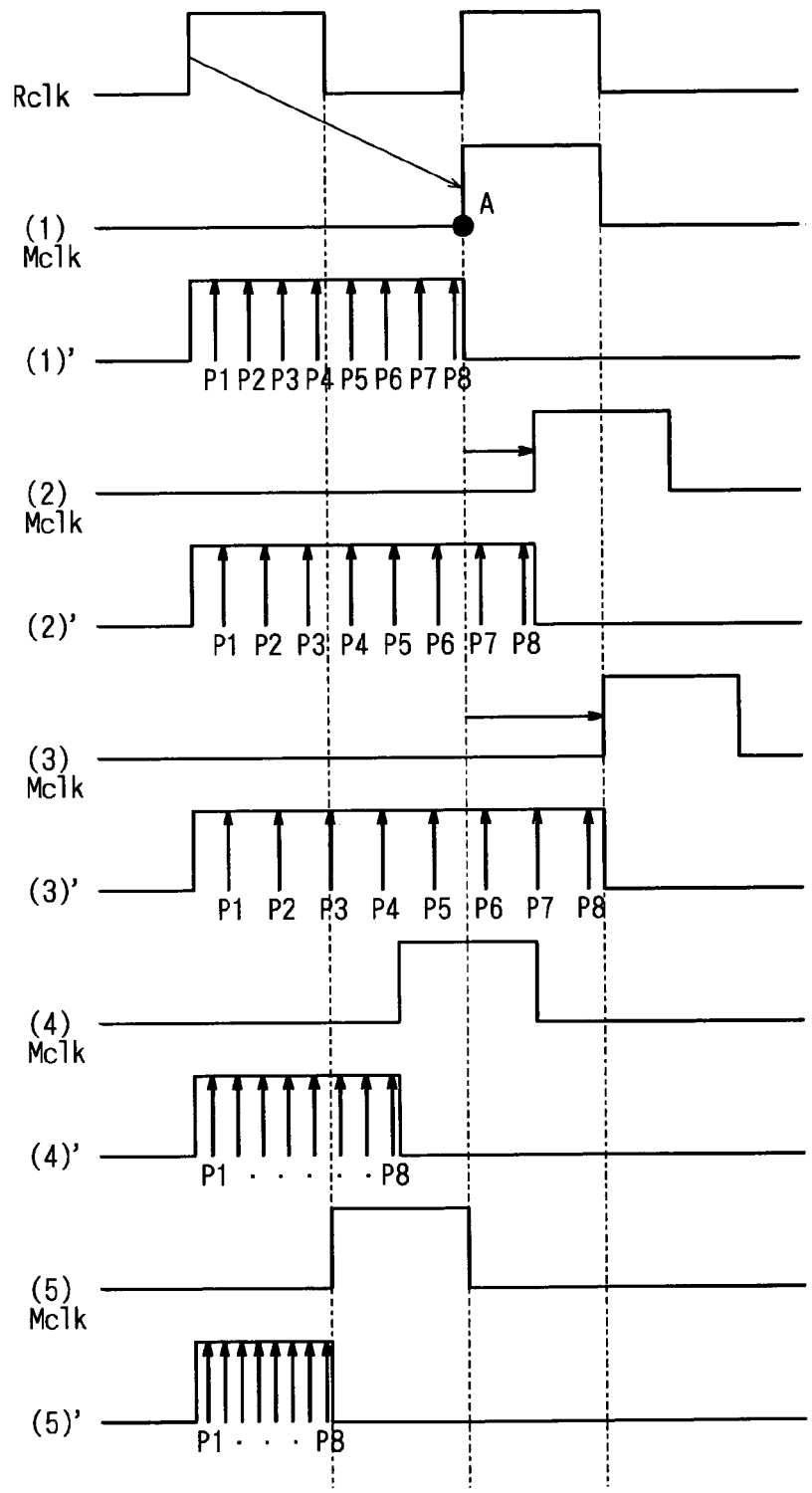
FIG. 5 is a timing chart illustrating the relation between the reference clock Rclk and the spectrum spread modulation clock Mclk, which explains the principle of detecting the phase difference.

FIG. 5 is a timing chart illustrating the relation between the reference clock Rclk and the spectrum spread modulation clock Mclk, which explains the principle of detecting the phase difference.

FIG. 5(1) shows the state that the phase of the reference clock Rclk coincides with that of the spectrum spread modulation clock Mclk, and the point A shows the rise of the spectrum spread modulation clock Mclk with one cycle delayed. The timing chart FIG. 5(1)' illustrated under FIG. 5(1) shows the rise times of the clock pulse outputs p1, p2, . . . p8 from each delay element of the variable delay circuit 2 in the operational state of FIG. 5(1). Here, the duty ratio of High/Low in the reference clock Rclk is assumed to be 50%. Here, the attention is focused on the rises of the clock pulse outputs p1, p2, . . . p8 from each delay element, however it may be on the falls.

FIG. 5(2) shows the state that the rise time of the spectrum spread modulation clock Mclk is delayed to the reference clock Rclk, and in the same manner, FIG. 5(2)' shows the rise times of the clock pulse outputs p1, p2, . . . p8 from each delay element of the variable delay circuit 2 in the operational state of FIG. 5(2).

FIG. 5(3) shows the state that the rise time of the spectrum spread modulation clock Mclk is delayed to the maximum value ½ Trclk, and in the same manner, FIG. 5(3)' shows the rise times of the clock pulse outputs p1, p2, . . . p8 from each delay element of the variable delay circuit 2 in the operational state of FIG. 5(3).

FIG. 5(4) shows the state that the rise time of the spectrum spread modulation clock Mclk is advanced to the reference clock Rclk, and in the same manner, FIG. 5(4)' shows the rise times of the clock pulse outputs p1, p2, . . . p8 from each delay element of the variable delay circuit 2 in the operational state of FIG. 5(4).

FIG. 5(5) shows the state that the rise time of the spectrum spread modulation clock Mclk is advanced to the maximum value ½ Trclk, and in the same manner, FIG. 5(5)' shows the rise times of the clock pulse outputs p1, p2, . . . p8 from each delay element of the variable delay circuit 2 in the operational state of FIG. 5(5).

The phase difference detection means of the delay setting circuit 11 is configured with logic circuits and/or a microcomputer. The level High/Low of the reference clock Rclk is judged at the rise times of the clock pulse outputs p1, p2, . . . p8 from each delay element illustrated in FIG. 5(1)' through FIG. 5(5)' (this may be done at the fall times, which is the same hereunder). Thereby, the operational state of the variable delay circuit 2, namely, the phase difference of the modulated clock to the reference clock created by the delay is detected. The delay setting circuit 11 varies the setting for generating the input control voltage to the variable delay circuit 2 that generates the spectrum spread modulation clock according to the detected result of the phase difference.

In the process of detecting the phase difference, if the reference clock Rclk is High at the rise times of the clock pulse outputs p1, p2, . . . p8 from each delay element, H signal is generated; and if it is Low, L signal is generated. The combination of H and L signals expresses the operational state of the variable delay circuit 2 at that moment.

In case of FIG. 5(1), since the reference clock Rclk is High at the rise times of the delay element outputs p1~p4, H signal is generated; since the reference clock Rclk is Low at the rise times of the delay element outputs p5~p8, L signal is generated.

In case of FIG. 5(2), since the reference clock Rclk is High at the rise times of the delay element outputs p1~p3, p7, and p8, H signal is generated; since the reference clock Rclk is Low at the rise times of the delay element outputs p4~p6, L signal is generated. Similarly in the case of FIG. 5(3), since the reference clock Rclk is High at the rise times of the delay element outputs p1, p2, and p6~p8, H signal is generated; since the reference clock Rclk is Low at the rise times of the delay element outputs p3~p5, L signal is generated.

The above explanation is made with the case in which the outputs of the delay elements are delayed to the reference clock Rclk. To make the same judgment as to the case in which the outputs of the delay elements are advanced to the reference clock Rclk will produce the results (4) and (5) illustrated in the following Table 1. Here, Table 1 shows to combine the judgment results of the delay element outputs p1 through p8 in the operational states of FIG. 5(1) through FIG. 5(5).

TABLE 1

|     | P1 | P2 | P3 | P4 | P5 | P6 | P7 | P8 |
| --- | --- | --- | --- | --- | --- | --- | --- | --- |
| (1) | H | H | H | H | L | L | L | L |
| (2) | H | H | H | L | L | L | H | H |
| (3) | H | H | L | L | L | H | H | H |
| (4) | H | H | H | H | H | L | L | L |
| (5) | H | H | H | H | H | H | H | H |

The delay setting circuit 11 judges whether the level of the reference clock Rclk is High or Low at the rise times of the clock pulse outputs p1, p2, ... p8 from each delay element. From the combinations of H and L signals thus acquired (see Table 1), the delay setting circuit 11 can detect the operational state of the variable delay circuit 2, namely, the phase difference of the modulated clock to the reference clock; accordingly, the delay setting circuit 11 is able to apply the phase modulation, while varying the setting of the variable delay circuit 2 into such a delay amount (phase) that the phase difference is confined within half the cycle Trclk.

Next, the phase modulation operation of the reference clock will be explained, which fluctuates the cycle of the modulated clock (spreads the spectrum) while additionally having the restriction that the phase difference is confined within half the cycle Trclk, as mentioned above.

When generating the modulated clock, the delay setting circuit 11 confines the phase difference within half the cycle Trclk as mentioned above; and when detecting that the phase difference reaches the upper limit or the lower limit (the states of (3) and (5) in FIG. 5 and Table 1), the delay setting circuit 11 changes the setting of the control up to that moment. That is, when the phase difference exceeds the limit in the setting of the lagging phase, the delay setting circuit 11 changes the setting toward the leading phase; and when the phase difference exceeds the limit in the setting of the leading phase, the delay setting circuit 11 changes the setting toward the lagging phase. However, in changing the setting toward the leading or lagging phase, the delay setting circuit 11 spreads the spectrum of the modulated clock at the same time; accordingly, the delay setting circuit 11 changes the setting in a manner that it fluctuates the cycle of the modulated clock as the result of the phase modulation by each cycle.

First, the basic operation of the phase control relating to the change of the setting will be explained. When changing the setting, the phase difference detection means incorporated in the delay setting circuit 11 instructs the change of the setting condition that the cycle of the clock pulse is changed by Dt toward either lagging or leading phase. Practically, in order to produce a phase difference required for changing the cycle by Dt, the variable delay circuit 2 is to input a control voltage DV relevant to the phase difference. The control can be made to lower the control voltage by DV or to raise it by DV, in relation to the lagging or leading phase. Here, the example of control will be explained which lowers the control voltage by DV and delays the phase.

The delay setting circuit 11 instructs the second charge pump 12 to take out the charge DQ corresponding to Dt, so as to give the control voltage DV required for delaying the phase and changing the clock cycle by Dt to the variable delay circuit 2 as the control input.

Figure 6:
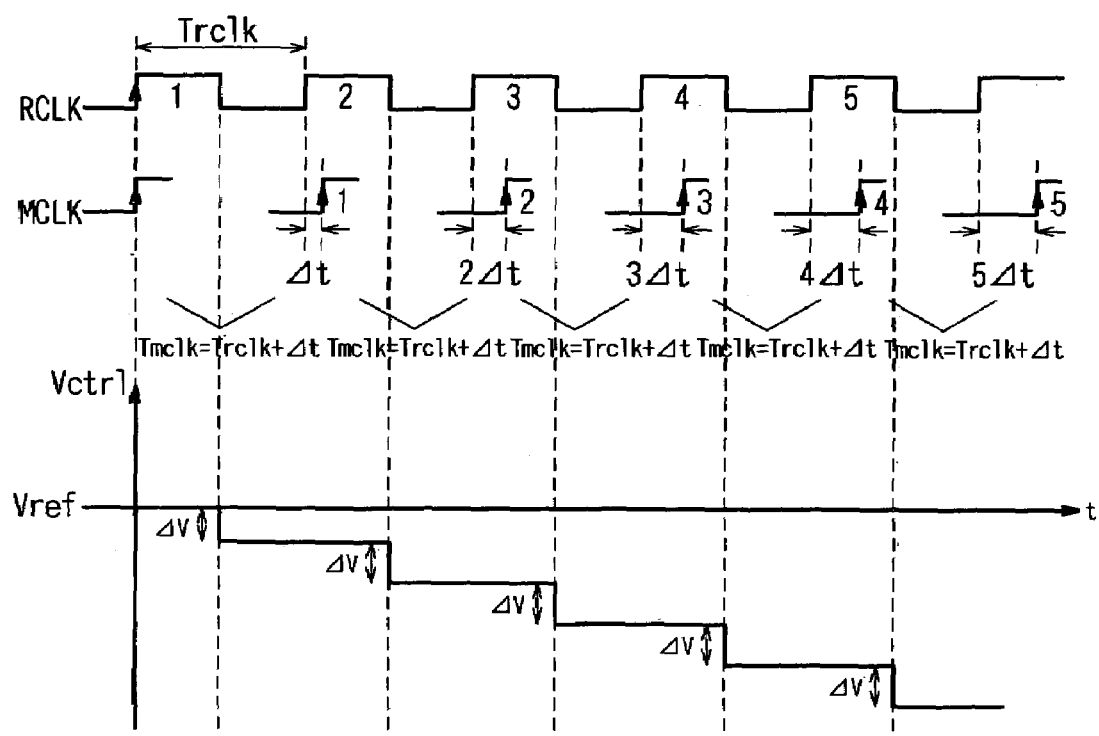
FIG. 6 is a timing chart of the clock phase-modulated by increasing the control input of the variable delay circuit by DV each cycle.

FIG. 6 is a timing chart of a phase-modulated clock by this control. FIG. 6 shows an example of the control to decrease a constant delay control voltage DV at each cycle of the reference clock Rclk. As illustrated in FIG. 6, in this example, as to the first clock of the modulated clock Mclk, the delay setting circuit 11 sets the delay control voltage Vctrl to Vref−DV. Here, Vref represents the delay control voltage, when the reference clock Rclk and the modulated clock Mclk are in phase. By this delay control voltage Vctrl (Vref−DV), the phase of the modulated clock Mclk is delayed by Dt from the reference clock Rclk. Similarly, as to the second clock, the delay setting circuit 11 sets the delay control voltage Vctrl to Vref−2DV. By this delay control voltage Vctrl (Vref−2DV), the phase of the modulated clock Mclk is delayed by 2Dt from the reference clock Rclk. In the same manner, as to the n-th clock, the phase of the modulated clock Mclk is delayed by nDt from the reference clock Rclk. Therefore, the cycle Tmclk of the modulated clock during these periods becomes the cycle Tclk of the reference clock Rclk+Dt, thus varying the cycle of the reference clock Rclk by Dt.

The example of control that lowers the control voltage by DV and delays the phase has been explained so far. In the same manner, the control can be made to raise the control voltage by DV and advance the phase.

In the above description of the basic operation of the phase control, when the phase difference of the reference clock and the modulated clock reaches the upper limit or the lower limit of the restriction, and when the delay setting circuit 11 changes the setting of the control condition up to that moment, it was explained that the delay setting circuit 11 is able to change the cycle of the modulated clock at the same time of delaying or advancing the phase (see FIG. 6).

However, in order to spread the spectrum of the modulated clock, it is necessary to change the setting condition so as to give dispersions to the cycle of the modulated clock.

Next will be described a preferred embodiment accompanied with the modulation operation that generates modulated clocks with spectrum spread, on the basis of the basic phase control operation.

In this embodiment, when the phase difference of the reference clock and the modulated clock reaches the upper limit or the lower limit of the restriction condition (half the cycle Trclk of the reference clock), and when it changes the setting of the control condition up to that moment, the delay setting circuit 11 fluctuates the cycle of the modulated clock in addition to changing the phase toward lagging or leading. However, in this case, the delay setting circuit 11 uses a modulation profile so as to give dispersions to the cycle and spread the spectrum of the modulated clock. The modulation profile is such that the phase difference of the reference clock and the modulated clock gradually increases and gradually decreases between the upper limit and lower limit of the restriction condition.

Figure 7:
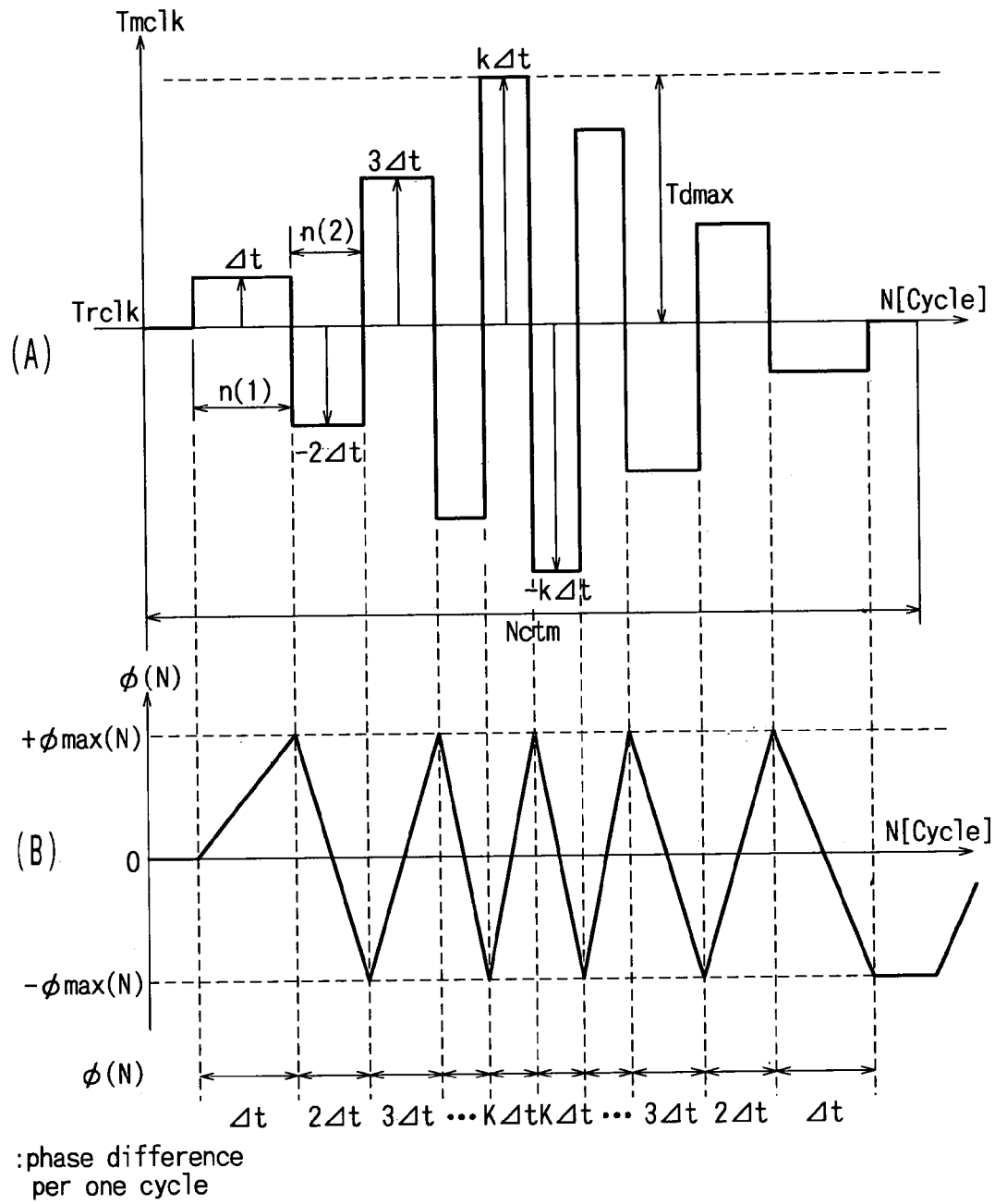
FIG. 7 is a timing chart illustrating the operating characteristic when the spectrum spread modulation clock is generated.

FIG. 7 is a timing chart illustrating the operating characteristic when the spectrum spread modulation clock is generated based on this embodiment. FIG. 7(A) shows the cycle Tmclk of the modulated clock against the clock cycle N, in which the cycle Tmclk is expressed by the variation (Dt) to the cycle Trclk of the reference clock, and the cycle Tmclk is fluctuated at each clocks n(1), n(2), ... FIG. 7(B) shows the phase difference of the reference clock and the modulated clock f(N) against the clock cycle N in correspondence with FIG. 7(A).

The phase difference f(N) illustrated in FIG. 7(B) is the phase difference per one cycle, +fmax(N) is related to the upper limit, and −fmax(N) is related to the lower limit of the restriction condition.

In the operating characteristic, as shown in FIG. 7(B), the phase difference f(N) repeats a gradual increase and a gradual decrease alternately between the upper limit +fmax(N) and the lower limit −fmax(N), and the phase difference characteristic lines connecting the upper limits and the lower limits (corresponding to the clocks n(1), n(2), ... in FIG. 7(A)) are shown by linear lines, because the modulated clock cycle Tmclk is set constant between the upper limit and the lower limit. However, the modulated clock cycles Tmclk having different values are set in each of the clocks (Dt, −2Dt, 3Dt ... in FIG. 7(A)), thus giving dispersions to the cycle of the modulated clock. In the example of FIG. 7, the modulation profile for the first half cycle is folded at the half cycle of the fluctuating cycle Nctm of the modulated clock, thus forming the profile for one cycle.

Thus, giving dispersions to the cycle of the modulated clock and fluctuating the cycle will enhance the effect of spectral diffusion.

Figure 9:
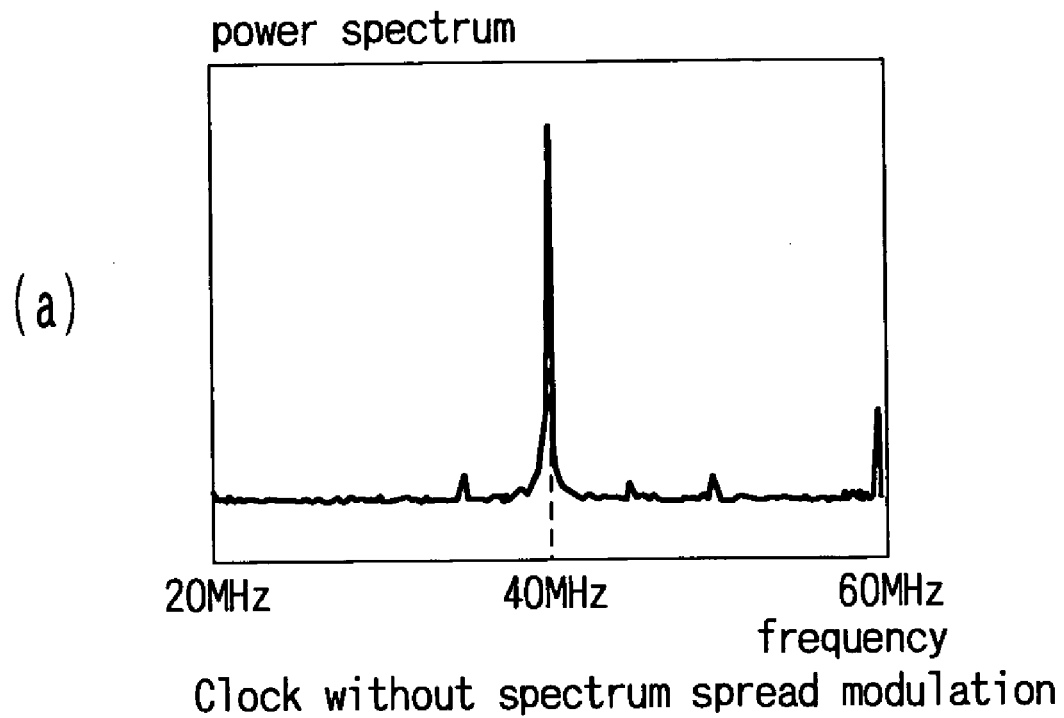
Figure 9:
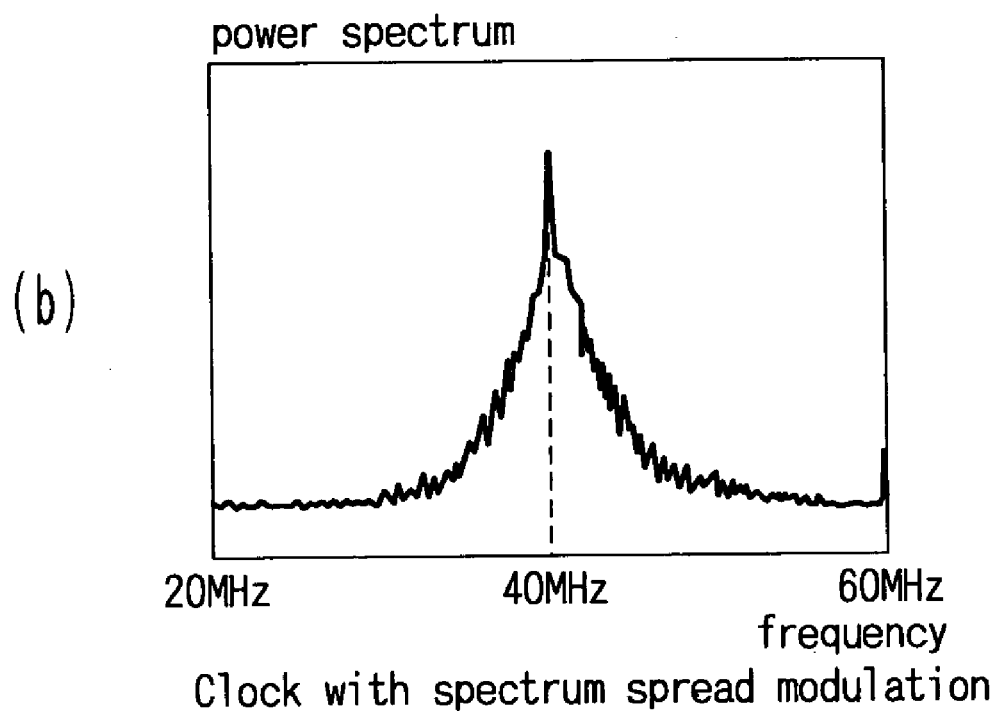

FIG. 9 shows a simulation result of the effect that the spectrum spread modulation clock according to this embodiment reduces the EMI.

FIG. 9A shows an analyzed result of the power spectrum of the clock without modulation from 20 MHz to 60 MHz, and FIG. 9B shows an analyzed result of the power spectrum of the clock with the spectrum spread modulation of this embodiment. FIG. 9A and FIG. 9B find that the peak value appearing at the center frequency is reduced and the bandwidth is widened in the case of the clock with the spectrum spread modulation, compared with the case of the clock without modulation.

Figure 8:
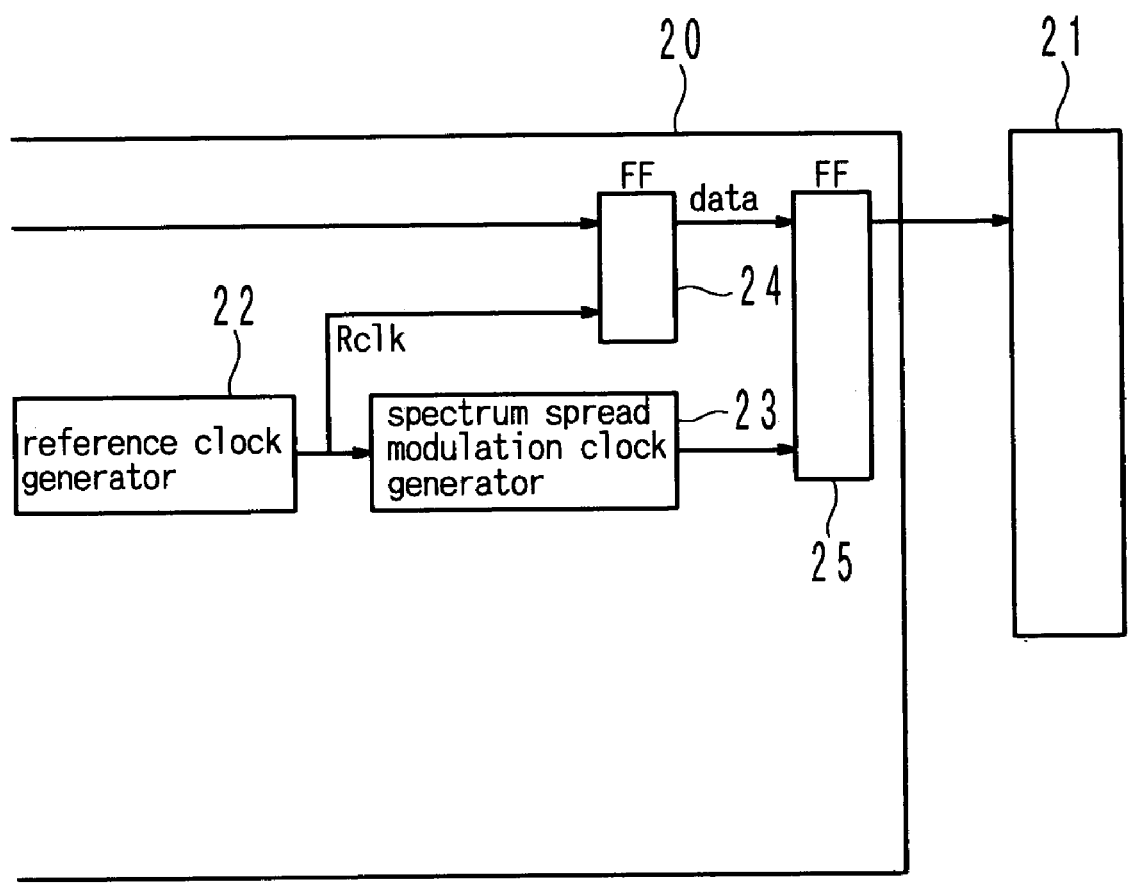
FIG. 8 is a block diagram of a data processing circuit to which the spectrum spread modulation clock generator of the invention is applied.

FIG. 8 illustrates a schematic diagram of a data processing circuit to which is applied the spectrum spread modulation clock generator relating to this invention.

In FIG. 8, when a data processing circuit 20 using a spectrum spread modulation clock generator 23 sends processed data to a circuit block 21 on the side of a user, the clock generator guarantees a certain extent of synchronization (that is, confines the phase difference of the modulated clock to the reference clock within half the cycle of the reference clock) with regard to the spectrum spread modulation clock, which will not exceed the cycle. Therefore, the data processing circuit 20 is only needed to include a reference clock generator 22, spectrum spread modulation clock generator 23, flip-flop 24 that fetches data based on the reference clock supplied from the reference clock generator 22 and transfers the data to a flip-flop 25 at the next stage, and the flip-flop 25 that fetches data based on the spectrum spread modulation clock and transfers the data to the circuit block 21 at the next stage. Therefore, it is possible to attain a normal operation without using the buffer memory as shown in the conventional example (see FIG. 10). Thus, according to the spectrum spread modulation clock generator, it is possible to provide a data processing circuit of high performance with simplified configuration, with a data transfer interface that saves the buffer memory for the data transfer interface as the element.

The clock generator of this invention uses the phase modulation system that controls the phase of the reference clock according to the variable setting condition at each clock cycle, and fluctuates the cycle of the modulated clock to thereby spread the spectrum thereof. Besides, the clock generator confines the phase difference of the reference clock and the spectrum spread clock after modulation within a specified range (so as not to exceed a specific limit value defined by the reference clock cycle as a unit), and thereby guarantees a certain extent of synchronization with regard to the spectrum spread clock. Therefore, in using the spectrum spread clock of this invention as the operating clock in various parts inside a system such as devices and circuits, the buffer memory becomes unnecessary, which conventionally had to be additionally used for the data transfer interface. Moreover, the clock generator can easily be adopted as the operating clock inside a system, and can enhance the performance of the system.

Further, since the circuit to control the phase of the reference clock is configured with the DLL circuit, it is possible to maintain the phase relation between the reference clock and the modulated clock at a constant, and to enhance the operational stability.

What is claimed is:

1. A clock generator comprising:
an input;
an output;
an oscillator that generates a reference clock,
a phase control means that receives the reference clock, controls a phase of the reference clock according to a variable setting condition at each clock cycle, and generates a phase controlled clock, comprising a phase comparator for comparing a phase of said reference clock with a phase controlled clock at said output, a first charge pump for controlling a first current according to an output from the phase comparator, and a second charge pump for controlling a second current, and
a delay setting circuit that is responsive to said phase control means and generates an output, said second charge pump receiving the output of said delay setting circuit,
wherein the phase control means varies a setting condition and operates continuously to spread a spectrum of the phase controlled clock outputted at said output.

2. A clock generator comprising:
a phase control means that receives a reference clock and controls a phase of the reference clock according to a variable setting condition at each clock cycle, and generates a phase controlled clock, said phase control means comprising a variable delay circuit, a first charge pump for controlling a first current, and a second charge pump having a capacity larger than said first charge pump for controlling a second current, and,
a delay setting circuit for providing an output to said second charge pump, wherein the first and second currents are combined and supplied to the variable delay circuit as a control input, and
wherein the phase control means varies a setting condition to continuously spread a spectrum of the phase controlled clock outputted at said output.

3. A clock generator as claimed in claim 1, wherein a variable delay circuit delays the reference clock to comply with a control input according to the setting condition, and said phase control means includes a circuit that detects a delayed state in the variable delay circuit, and regulates the control input to the variable delay circuit in such a manner that a phase difference of the phase controlled clock to the reference clock does not exceed a specific limit value defined by the reference clock cycle as a unit.

4. A clock generator as claimed in claim 1, wherein the phase control means regulates the control input according to such a profile that the phase difference of the phase controlled clock to the reference clock gradually increases and gradually decreases between the upper limit and lower limit of the specific limit value defined by the reference clock cycle as a unit.

5. A clock generator as claimed in claim 3, wherein said phase control means comprises a DLL circuit containing the variable delay circuit as a circuit element, wherein the phase control means synthesizes the control input to the variable delay circuit.

6. A clock generator comprising:
an input;
an output;
an oscillator that generates a reference clock, and
a phase control means that receives the reference clock, controls a phase of the reference clock according to a variable setting condition at each clock cycle, and generates a phase controlled clock, wherein the phase control means varies a setting condition to continuously spread a spectrum of the phase controlled clock outputted at said output, wherein the phase control means includes (1) a variable delay circuit that delays the reference clock to comply with a control input according to the setting condition, (2) a circuit that detects a delayed state in the variable delay circuit and regulates the control input to the variable delay circuit in such a manner that a phase difference of the phase controlled clock to the reference clock does not exceed a specific limit value defined by the reference clock cycle as a unit, and (3) a DLL circuit containing the variable delay circuit as a circuit element, wherein phase control means synthesizes the control input to the variable delay circuit, and wherein:

the variable delay circuit delays the reference clock based on a control voltage;

the DLL circuit includes a comparator that compares the phase of a delayed output clock from the variable delay circuit and the phase of the reference clock, and a first charge pump that controls a first current and generates the control voltage to the variable delay circuit according to a phase difference output from the comparator; and the phase control means uses a second charge pump of which capacity is greater than that of the first charge pump, in a circuit for adjusting the control input, and generates the control voltage according to a phase difference set as a control condition.

7. A clock generator as claimed in claim 1, wherein said delay setting circuit output is a control voltage, which is required for delaying a phase and changing a clock cycle by a predetermined amount, to a variable delay circuit in said phase control means as a control input.

* * * * *